US012620935B2

(12) United States Patent     (10) Patent No.:   US 12,620,935 B2

Furceri et al.     (45) Date of Patent:     May 5, 2026

(54) CIRCUIT AND METHOD TO DETECT FAULTS OF A MEMS DEVICE INCLUDING AN OSCILLATING MASS

(71) Applicant: STMicroelectronics International N.V., Geneva (CH)

(72) Inventors: Raffaele Enrico Furceri, Legnano (IT); Marco Zamprogno, Cesano Maderno (IT)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 18/751,595

(22) Filed: Jun. 24, 2024

(65) Prior Publication Data

US 2025/0007463 A1     Jan. 2, 2025

(30) Foreign Application Priority Data

Jun. 30, 2023    (IT) ........................ 102023000013692

(51) Int. Cl.
   *H03D 3/00*       (2006.01)
   *H03D 7/16*       (2006.01)

(52) U.S. Cl.
   CPC ............. *H03D 3/009* (2013.01); *H03D 3/008* (2013.01); *H03D 7/165* (2013.01)

(58) Field of Classification Search
   CPC ........ H03D 3/009; H03D 3/008; H03D 7/165; G01R 31/2829; G02B 26/0833; B81C 99/005; B81B 2201/042
   See application file for complete search history.

(56) References Cited

U.S. PATENT DOCUMENTS

| | | | |
|---|---|---|---|
| 9,287,839 B1* | 3/2016 | Amadi ................ | H03F 3/45659 |
| 10,567,854 B1* | 2/2020 | Muddiman ............. | H04Q 9/02 |
| 2009/0251129 A1* | 10/2009 | Todorokihara ......... | G01R 23/10 |
| | | | 324/76.39 |
| 2012/0217609 A1* | 8/2012 | Tanabe ................ | G01P 15/0897 |
| | | | 438/54 |
| 2012/0307211 A1 | 12/2012 | Hofmann et al. | |
| 2019/0145773 A1* | 5/2019 | Collin ................ | G01C 19/5776 |
| | | | 73/504.12 |

(Continued)

OTHER PUBLICATIONS

Machine translation of RU-2263284-C2 (Year: 2005).*

(Continued)

*Primary Examiner* — Jean B Corrielus

(74) *Attorney, Agent, or Firm* — Crowe & Dunlevy LLC

(57) ABSTRACT

Faults in a periodically oscillating MEMS mass are detected by processing a position signal, having an amplitude and oscillation frequency, generated as a function of mass position. First and second reference signals formed by samples of quadrature sinusoids at the oscillation frequency are generated. First and second multipliers generate a first product signal and a second product signal, respectively, via multiplication of the position signal by the first and second reference signals. The first and second product signals are low pass filtered to generate first and second filtered signals, respectively. An estimator circuit determines estimates of the amplitude as a function of the first and second filtered signals. A decision circuit detects the presence of faults on the basis of a comparison of the estimates with a range of values.

13 Claims, 5 Drawing Sheets

(56) References Cited

U.S. PATENT DOCUMENTS

2020/0271921  A1      8/2020  Kimura
2020/0408524  A1 *  12/2020  Hu ..................... G01C 19/5776
2021/0364292  A1 *  11/2021  Kuisma ............. G01C 19/5712
2023/0234836  A1 *    7/2023  Furceri ............... G02B 26/101
                                                          359/578

OTHER PUBLICATIONS

Machine translation of DE-102004047511-A1 (Year: 2006).*
IT Search Report and Written Opinion for priority application, IT
Appl. No. 102023000013692, report dated Jan. 31, 2024, 6 pgs.

* cited by examiner

CIRCUIT AND METHOD TO DETECT FAULTS OF A MEMS DEVICE INCLUDING AN OSCILLATING MASS

PRIORITY CLAIM

This application claims the priority benefit of Italian Application for Patent No. 102023000013692, filed on Jun. 30, 2023, the content of which is hereby incorporated by reference in its entirety to the maximum extent allowable by law.

TECHNICAL FIELD

The present invention relates to a circuit and to a method to detect faults in a MicroElectroMechanical System (MEMS) device including an oscillating mass.

BACKGROUND

As is known, there are today available MEMS devices that envisage the presence of a mobile mass, which, in use, oscillates, for example, linearly or angularly.

For instance, MEMS mirrors are known, in which the mobile mass is formed by a so-called micromirror, which oscillates angularly. Generally, MEMS mirrors are driven at a desired frequency, which typically is approximately equal to the resonance frequency, so as to maximize the angle of aperture, i.e., the amplitude of the (angular) oscillation of the micromirror, and reduce consumption levels.

Further available are malfunction-detection circuits, also known as "fault-detection circuits", which, when coupled, for example, to a MEMS mirror, continuously detect whether a reduction of the angle of aperture of the micromirror occurs, for example, because the micromirror is driven at a frequency higher or lower than the desired frequency. Further, fault-detection circuits are able to detect possible situations of failure of the micromirror, i.e., situations in which the micromirror is no longer able to move.

Fault-detection circuits are designed so as to detect possible faults in times as short as possible and in a reliable way, i.e., so as to detect any possible malfunctioning, without giving rise to so-called false positives. Further, fault-detection circuits must ideally be simple from a circuit standpoint in order to reduce the consumption levels and the overall dimensions and facilitate the corresponding calibration procedures.

An example of circuit to detect faults in a micromirror is illustrated in United States Patent Application Publication No. 2018/0129036 A1 (incorporated herein by reference). This solution envisages providing a differentiator circuit downstream of an analog-to-digital converter so as to have a shorter response time. However, it has been noted how, on account of the frequency response of a highpass type that characterizes the differentiator, this solution is extremely subject to the phenomenon of high-frequency noise, with consequent degradation of the performance.

There is a need in the art to provide a fault-detection circuit that will overcome at least in part the drawbacks of the prior art.

SUMMARY

Embodiments herein concern a circuit and a method to detect faults.

In an embodiment, a circuit is provided to detect faults in a MEMS device including a mass that oscillates periodically.

The circuit is configured to receive a position signal formed by a succession of samples of an analog signal that is a function of the position of the mass and has an amplitude and an oscillation frequency. The fault-detection circuit comprises: a reference circuit configured to generate a first reference signal and a second reference signal formed by successions of samples of a first sinusoidal signal and, respectively, a second sinusoidal signal, the first and second sinusoidal signals having a frequency equal to the oscillation frequency and being phase-shifted with respect to one another by 90°; a first multiplier configured to generate a first product signal by multiplication of the position signal and the first reference signal; a second multiplier configured to generate a second product signal by multiplication of the position signal and the second reference signal; a first filter and a second filter of a lowpass type configured to filter, respectively, the first and second product signals and generating, respectively, a first filtered signal and a second filtered signal; an estimator circuit configured to determine estimates of said amplitude as a function of the first and second filtered signals; and a decision circuit configured to compare the estimates of said amplitude with a range of values and to detect the presence of faults on the basis of the outcomes of the comparisons.

In an embodiment, a method is presented to detect faults in a MEMS device including a mass that oscillates periodically on the basis of a position signal formed by a succession of samples of an analog signal that is a function of the position of the mass and has an amplitude and an oscillation frequency. The method comprises: generating a first reference signal and a second reference signal formed by successions of samples of a first sinusoidal signal and a second sinusoidal signal, respectively, the first and second sinusoidal signals having a frequency equal to the oscillation frequency and being phase-shifted with respect to one another by 90°; generating a first product signal via multiplication of the position signal and the first reference signal; generating a second product signal via multiplication of the position signal and of the second reference signal; generating a first filtered signal and a second filtered signal via lowpass filtering of the first product signal and of the second product signal, respectively; determining estimates of said amplitude as a function of the first and second filtered signals; and comparing the estimates of said amplitude with a range of values and detecting the presence of faults on the basis of the outcomes of the comparisons.

BRIEF DESCRIPTION OF THE DRAWINGS

For a better understanding of the present invention, embodiments thereof are now described, purely by way of non-limiting example, with reference to the attached drawings, wherein.

US 12,620,935 B2

3

Figure 7:
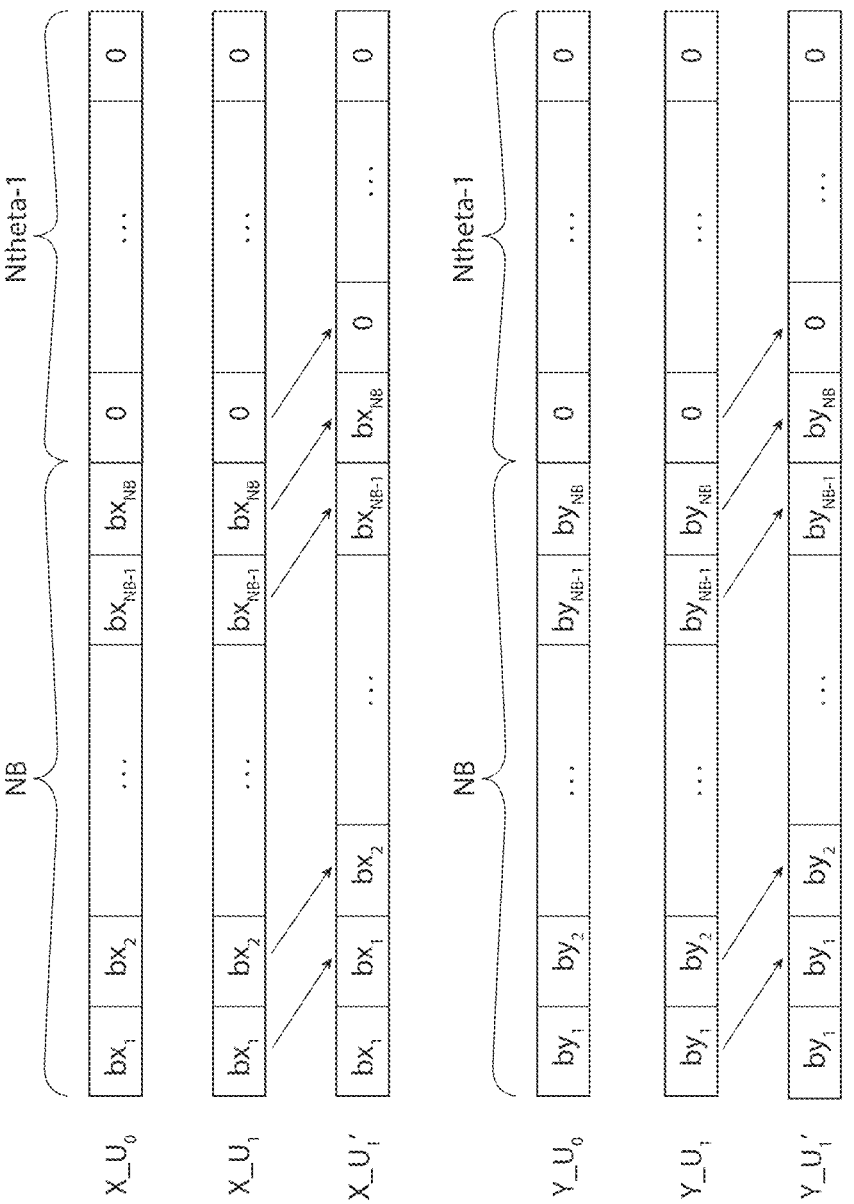

FIG. 7 is a schematic illustration of the structure of bit strings.

DETAILED DESCRIPTION

Figure 1:
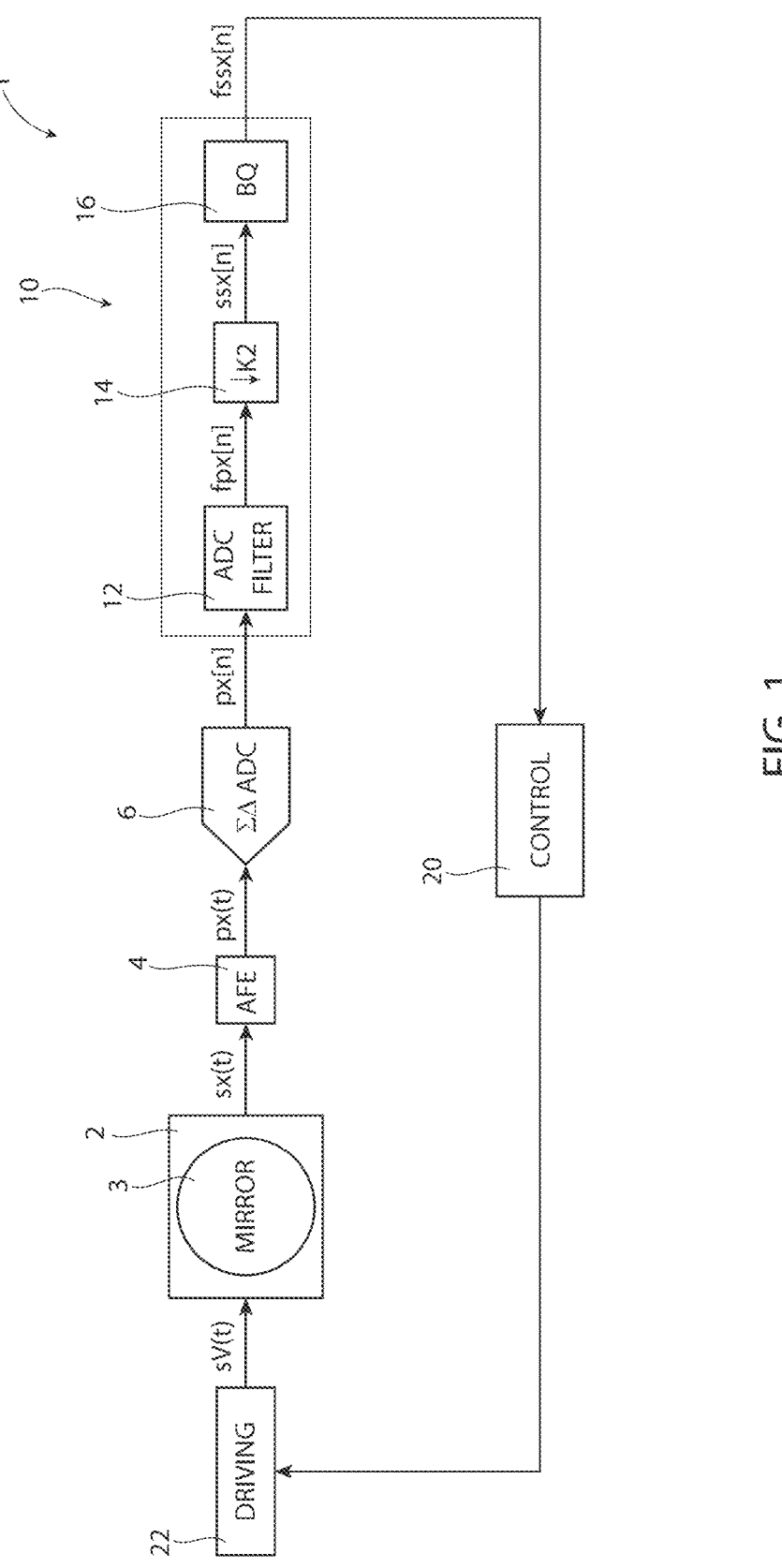
FIG. 1 shows a circuit diagram of a circuit for driving a micromirror.

FIG. 1 shows a driving circuit 1 coupled to a MEMS device 2 including a micromirror 3. In this connection, in what follows, the present description makes precise reference to the case where the mobile mass of the MEMS device 2 is formed by the micromirror 3, which oscillates angularly. However, variants are possible (which are not explicitly illustrated) in which the mobile mass is different from a mirror and/or in which the mobile mass oscillates, for example, linearly, instead of angularly, as in the case for example of a MEMS gyroscope.

In detail, the driving circuit 1 comprises an analog front-end (AFE) circuit 4 of an analog type, which is coupled to the MEMS device 2 so as to receive a position signal sx(t) of an analog and continuous-time type, which is indicative of the angular position of the micromirror 3. In particular, the position signal sx(t) is generated in a per se known manner by the MEMS device 2, for example via implementation of a mechanism of detection of angular position of a capacitive type. On the basis of the position signal sx(t), the front-end circuit 4 generates a processed position signal px(t) of an analog and continuous-time type; for example, the front-end circuit 4 may carry out an anti-alias filtering of the position signal sx(t) and/or may carry out an adaptation of the dynamic range of the position signal sx(t). In particular, as explained in greater detail hereinafter, the position signal sx(t) and the processed position signal px(t) are sinusoidal signals, with a frequency equal to the oscillation frequency of the micromirror 3, designated in what follows by frequency $f_{sense}$.

The driving circuit 1 further comprises an analog-to-digital converter (ADC) 6 and a filtering circuit 10, which in turn comprises a digital filter 12, a subsampler 14, and a series of biquadratic (BQ) filters 16.

In detail, the input of the analog-to-digital converter 6 is connected to the output of the front-end circuit 4 in such a way that the analog-to-digital converter 6 generates a sampled position signal px[n], starting from the processed position signal px(t). For instance, the analog-to-digital converter 6 is an analog-to-digital converter of a sigma-delta ($\Sigma\Delta$) type. Further, the analog-to-digital converter 6 generates the samples of the sampled position signal px[n] with a first sampling frequency $f_{ADC}$.

In greater detail, as mentioned previously, the front-end circuit 4 may adjust the dynamic range of the processed position signal px(t) as a function of the dynamic range of the analog-to-digital converter 6. Furthermore, the samples of the sampled position signal px[n] may be expressed as follows (neglecting contributions of white and flicker noise):

$$A_{sense} \cdot \sin(\omega_{sense} \cdot n \cdot t_s + \varphi_{sense}) + QN + OS, \text{ with } n = 0, 1, 2, \ldots$$

where: $A_{sense}$ is an amplitude directly proportional to the amplitude of the (angular) oscillation of the micromirror 3; $\omega_{sense}=2\pi \cdot f_{sense}$; $t_s$ is the sampling period and is equal to $1/f_{ADC}$; $\varphi_{sense}$ is the phase with which the micromirror 3 oscillates (but for possible contributions of phase shift introduced by the front-end circuit 4 and by the analog-to-digital converter 6); QN is a contribution of quantization noise, caused by the sampling carried out by the analog-to-digital converter 6; and OS is a possible offset contribution.

For instance, and without this implying any loss of generality, $A_{sense}$ may depend linearly upon the amplitude of oscillation of the micromirror 3 via a constant equal to Ksense·G_AFE/Vref_ADC, where: G_AFE is the gain introduced by the front-end circuit 4; Ksense is a constant such that the amplitude of the position signal sx(t) (this being, for example, a voltage signal) is equal to the product of the constant Ksense by the amplitude of oscillation of the micromirror 3; and Vref_ADC is a normalization voltage of the analog-to-digital converter 6.

The input of the digital filter 12 is connected to the output of the analog-to-digital converter 6 in such a way that the digital filter 12 generates a filtered digital signal fpx[n] as a function of the sampled position signal px[n]. For instance, the digital filter 12 is a lowpass filter. In addition, the digital filter 12 generates the samples of the filtered digital signal fpx[n] at the first sampling frequency $f_{ADC}$.

The input of the subsampler 14 is connected to the output of the digital filter 12 in such a way that the subsampler 4 generates a subsampled signal ssx[n], on the basis of the filtered digital signal fpx[n] and by a subsampling (or decimation). For instance, the subsampler 14 generates the subsampled signal ssx[n] by selecting, for each set formed by a number K2 of successive samples of the filtered digital signal fpx[n], a corresponding sample (for example, the first) and discarding the other K2-1 samples in such a way that the samples of the subsampled signal ssx[n] are generated at a second sampling frequency $f_{BQ}$ equal to $f_{ADC}/K2$. In practice, K2 is the so-called subsampling factor of the subsampler 14 and is, for example, equal to ten.

Albeit not illustrated, the series of biquadratic filters 16 may be formed by a number of (for example, four) biquadratic digital filters cascaded together. In addition, the input of the series of biquadratic filters 16 is connected to the output of the subsampler 14 in such a way that, at output from the series of biquadratic filters 16, a filtered subsampled signal fssx[n] is present, which is a function of the subsampled signal ssx[n] and the samples of which are generated at a frequency equal to the second sampling frequency $f_{BQ}$. The biquadratic filters may be different from one another and may, for example, implement, as a whole, a bandpass filtering centred on the frequency $f_{sense}$.

The driving circuit 1 further comprises a control circuit 20 and an oscillation driving circuit 22.

The control circuit 20 has an input connected to the output of the series of biquadratic filters 16 so as to receive the filtered subsampled signal fssx[n], and an output that is connected to the input of the oscillation driving circuit 22. Furthermore, the output of the oscillation driving circuit 22 is coupled to the MEMS device 2.

In a per se known manner, the control circuit 20 includes a respective phase-locked-loop (PLL) circuit (not illustrated), which generates a timing signal (not illustrated) having a frequency equal to a timing frequency $f_{PLL}$.

In addition, the control circuit 20 controls the oscillation driving circuit 22 in such a way that the oscillation driving circuit 22 generates a driving signal sV(t) of an analog type, which is, for example, a square-wave voltage signal with a frequency equal to a driving frequency $f_{DRV}$ and an amplitude equal to an amplitude $V_{DRV}$. The driving signal sV(t) is applied in a per se known manner to actuators (not illustrated) present in the MEMS device 2 in such a way as to force oscillation of the micromirror 3 at a frequency equal to the driving frequency $f_{DRV}$. It consequently happens that the oscillation frequency $f_{sense}$ of the micromirror 3 is equal to the driving frequency $f_{DRV}$. The actuators may, for example, be electrostatic or piezoelectric actuators and may be driven in a differential way, on the basis of the driving signal sV(t).

This having been said, the analog-to-digital converter 6 is timed on the basis of the timing signal in such a way that the relation $f_{ADC}=f_{PLL}/K1$ applies. Further, the driving frequency $f_{DRV}$ is a function of the timing frequency $f_{PLL}$; in particular, purely by way of example, in what follows it is assumed that $$f_{DRV} = f_{PLL}/(16 \times K1 \times K2)$$

Consequently, also the following relations apply:

$$f_{ADC} = 16 \times K2 \times f_{DRV}$$

$$f_{BQ} = 16 \times f_{DRV}$$

Furthermore, in a per se known manner, the control circuit 20, the oscillation driving circuit 22, the MEMS device 2, the front-end circuit 4, the analog-to-digital converter 6, and the filtering circuit 10 form a closed control loop, which sets the value of the driving frequency $f_{DRV}$ so that it will, for example, be substantially equal to the resonance frequency of the micromirror 3.

In particular, also the filtered subsampled signal fssx[n] is indicative of the amplitude $A_{sense}$ (but for possible scale factors introduced by the digital filter 12, the subsampler 14, and the series of biquadratic filters 16) and of the phase $\varphi_{sense}$ (but for possible contributions of phase shift introduced by the digital filter 12, the subsampler 14, and the series of biquadratic filters 16). Consequently, in a per se known manner and thus not described in greater detail, the control circuit 20 may, for example, compare the amplitude $A_{sense}$ and the phase $\varphi_{sense}$, respectively, with a calibration amplitude $A_{cal}$ and a calibration phase $\varphi_{cal}$ and may impose the timing frequency $f_{PLL}$ (and thus also the driving frequency $f_{DRV}$) and the amplitude $V_{DRV}$, respectively, as a function of the difference $\varphi_{sense}-\varphi_{cal}$ and of the difference $A_{sense}-A_{cal}$, where the calibration amplitude $A_{cal}$ and the calibration phase $\varphi_{cal}$ represent the values of the amplitude and of the phase of the oscillations of the micromirror 3 when the micromirror 3 is driven at the desired frequency (in the present example, the resonance frequency), in the absence of faults, and may be determined in a circuit of calibration of the MEMS device 2.

For instance, the amplitude $V_{DRV}$ may have a proportional-integral-derivative dependence upon the difference $A_{sense}-A_{cal}$. Likewise, the timing frequency $f_{PLL}$ (and thus also the driving frequency $f_{DRV}$) may have a proportional-integral-derivative dependence upon the difference $\varphi_{sense}-\varphi_{cal}$. The control circuit 20 thus causes the timing signal to be phase-locked with the position signal sx(t), with the processed position signal px(t), and with the sampled position signal px[n]; it thus causes the timing frequency $f_{PLL}$ to be locked to the oscillation frequency $f_{sense}$ of the micromirror 3 so that the latter frequency, which is equal to a submultiple of the timing frequency $f_{PLL}$, will be equal to the resonance frequency of the micromirror 3.

In practice, the aforementioned closed control loop, in addition to making it possible to set the driving frequency $f_{DRV}$ at the value of the resonance frequency, also acts as control loop of the gain (i.e., of the amplitude) so as to obtain ideally, in the absence of any malfunctioning, $A_{sense}=A_{cal}$.

Figures 2, 3:
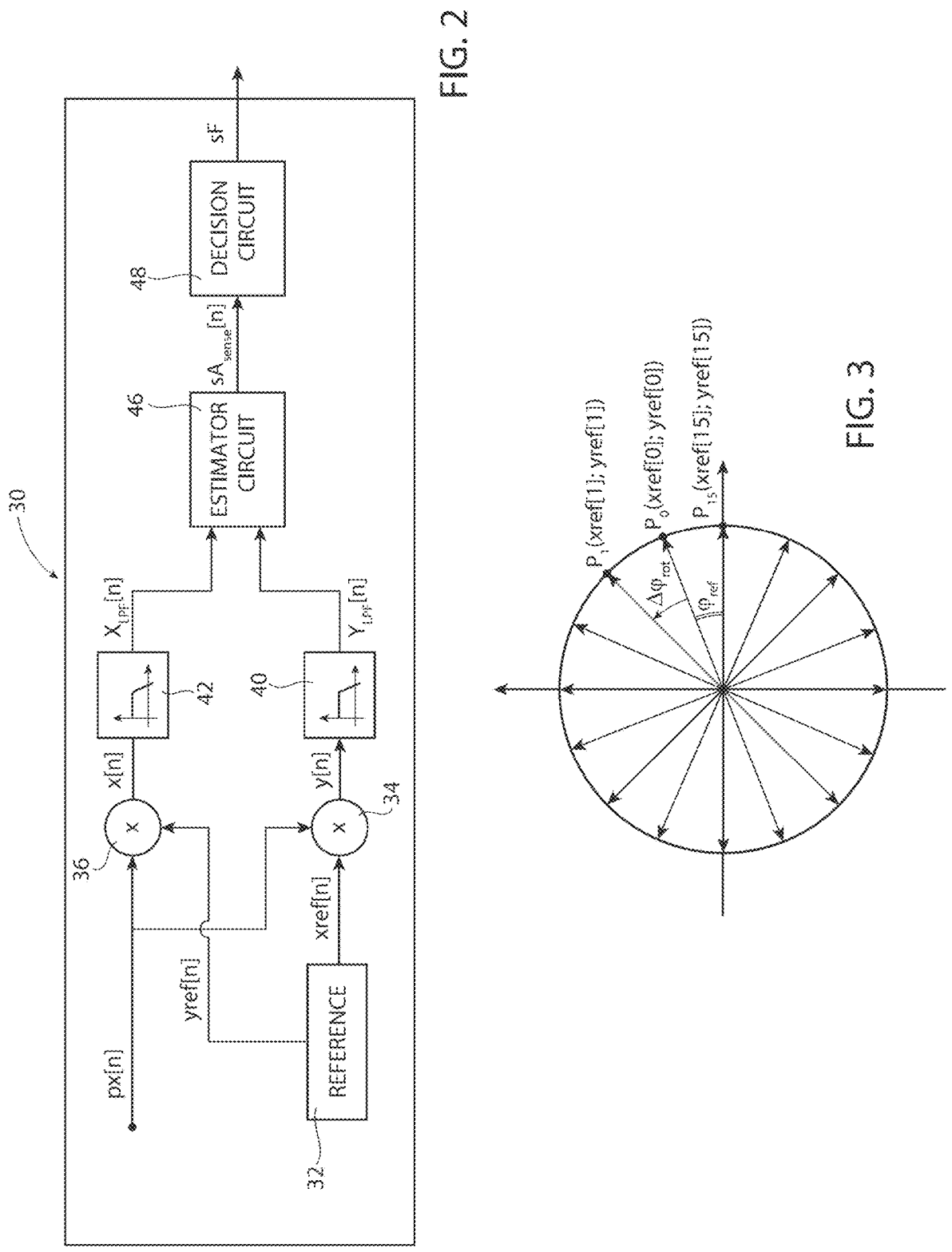
FIG. 2 shows a circuit diagram of a fault-detection circuit.
FIG. 3 is a schematic illustration of points arranged on a goniometric circle.

All this having been said, FIG. 2 shows a fault-detection circuit 30, which is coupled to the analog-to-digital converter 6 so as to receive the sampled position signal px[n].

In particular, the fault-detection circuit 30 comprises a reference generator 32, a first multiplier circuit 34 and a second multiplier circuit 36, and a first lowpass filter 40 and a second lowpass filter 42. It will be noted that there is no pre-filtering operation performed on the sampled position signal px[n] prior to being multiplied using the first multiplier circuit 34 and the second multiplier circuit 36. Thus, isolation of the resonant signal for fault detection is performed on the sampled position signal px[n] coming from the sensor, without a preliminary filtering action. An advantage of this configuration is that it permits a fast fault detection as the inclusion of any preliminary filtering of the sampled position signal px[n] would adversely introduce a large time constant causing a slowing of fault detection and reaction time. The first lowpass filter 40 and second lowpass filter 42 function to notch out intermodulation products of the multiplication operations performed by the first multiplier circuit 34 and the second multiplier circuit 36. This improves the precision of the extraction of DC components.

The reference generator 32 has a first output and a second output, on which it generates, respectively, a first reference signal xref[n] and a second reference signal yref[n], both of a digital type and with a sampling frequency equal to the first sampling frequency $f_{ADC}$.

In greater detail, the samples of the first reference signal xref[n] are, respectively, as follows:

$$\cos(\omega_{ref} \cdot n \cdot t_s + \varphi_{ref}), \text{ with } n = 0, 1, 2, \ldots$$

where: $\omega_{ref}=2\pi \times f_{ref}$, with $f_{ref}=f_{DRV}$; and $\varphi_{ref}$ is an arbitrary reference phase. Albeit not illustrated, in order to obtain $f_{ref}=f_{DRV}$, the reference generator 32 is coupled to the control circuit 20.

Furthermore, the samples of the second reference signal yref[n] are, respectively, as follows:

$$\sin(\omega_{ref} \cdot n \cdot t_s + \varphi_{ref}), \text{ with } n = 0, 1, 2, \ldots$$

In practice, for each value of n, the corresponding samples of the first and second reference signals xref[n], yref[n] form a pair of co-ordinates (xref[n]; yref[n]) that identifies the position of a corresponding point $P_i$ on a goniometric circle, as illustrated, for example, in FIG. 3, with I=n mod (R), where $R=f_{ADC}/f_{DRV}$ and "mod" denotes the modulo operation according to modular arithmetic (in FIG. 3, for simplicity of representation, it is assumed that R=16).

Further, the $i+1^{th}$ point P has the following co-ordinates:

$$xref[i + 1] = \cos(\varphi_{i+1}) = \cos(\varphi_i + \Delta\varphi_{rot})$$

$$yref[i + 1] = \sin(\varphi_{i+1}) = \sin(\varphi_i + \Delta\varphi_{rot})$$

with:

$$\Delta\varphi_{rot} = 360°/(f_{ADC}/f_{DRV});$$

$$\varphi_0 = \varphi_{ref}; \text{ and}$$

$$i = 0, 1, 2, \ldots, (f_{ADC}/f_{DRV} - 1).$$

Consequently, in order to generate the samples of the first and second reference signals xref[n], yref[n] in a computationally efficient way, the reference generator 32 may calculate the $i+1^{th}$ samples of the first and second reference signals xref[n], yref[n] in the following way:

$$xref[i + 1] = xref[i]x \cdot xrot - yref[i]x \ yrot$$

$$yref[i + 1] = xref[i]x \ yrot + yref[i]x \cdot xrot$$

with:

$$xref[0] = \cos(\varphi_{ref});$$

$$yref[0] = \sin(\varphi_{ref});$$

$$xrot = \cos(\Delta\varphi_{rot});$$

$$yrot = \sin(\Delta\varphi_{rot});$$

$$\text{and with } i = 0, 1, 2, \ldots, (f_{ADC}/f_{DRV} - 1).$$

The reference generator 32 is thus able to calculate any pair of samples of the first and second reference signals xref[n], yref[n] on the basis of the relations referred to above, thus on the basis of linear combinations of the samples of the previous pair, without having to implement any look-up table.

Irrespective of the details regarding generation of the samples of the first and second reference signals xref[n], yref[n], the first multiplier circuit 34 has a first input and a second input, which are, respectively, connected to the output of the analog-to-digital converter 6 and to the first output of the reference generator 32 so as to receive, respectively, the sampled position signal px[n] and the first reference signal xref[n].

The second multiplier circuit 36 has a first input and a second input, which are, respectively, connected to the output of the analog-to-digital converter 6 and to the second output of the reference generator 32 so as to receive, respectively, the sampled position signal px[n] and the second reference signal yref[n].

The first multiplier circuit 34 multiplies each sample of the sampled position signal px[n] by the corresponding sample of the first reference signal xref[n] so as to generate a first product signal y[n] of a digital type, the samples of which to a first approximation are, respectively, equal (neglecting the contributions of white and flicker noise) to:

$$\frac{Asense}{2} \cdot [\sin(\Delta\varphi) + \sin(2 \cdot \omega ref \cdot n \cdot ts + \varphi sense + \varphi ref)] +$$

$$OS \cdot \cos(\omega ref \cdot n \cdot ts + \varphi ref) + QN \cdot \cos(\omega ref \cdot n \cdot ts + \varphi ref),$$

$$\text{with } n = 0, 1, 2, \ldots \text{ where } \Delta\varphi = \varphi_{sense} - \varphi_{ref}.$$

The second multiplier circuit 36 multiplies each sample of the sampled position signal px[n] by the corresponding sample of the second reference signal yref[n] so as to generate a second product signal x[n] of a digital type, the samples of which to a first approximation are, respectively, equal (neglecting the contributions of white and flicker noise) to:

$$\frac{Asense}{2} \cdot [\cos(\Delta\varphi) - \cos(2 \cdot \omega ref \cdot n \cdot ts + \varphi sense + \varphi ref)] +$$

$$OS \cdot \sin(\omega ref \cdot n \cdot ts + \varphi ref) + QN \cdot \sin(\omega ref \cdot n \cdot ts + \varphi ref),$$

$$\text{with } n = 0, 1, 2, \ldots$$

The inputs of the first and second lowpass filters 40, 42 are, respectively, connected to the outputs of the first and second multiplier circuits 34, 36 in such a way as to generate, respectively, a first filtered signal $Y_{LPF}[n]$ and a second filtered signal $X_{LPF}[n]$, which are obtained by lowpass filtering of the first product signal y[n] and the second product signal x[n], respectively.

In particular, the first and second lowpass filters 40, 42 are digital filters, for example, identical to one another and designed to filter components at the frequency $f_{ref}$ in addition to the corresponding harmonics. In this connection, it may be shown that both the first product signal y[n] and the second product signal x[n] have undesired spectral contributions at the frequency $f=2 \cdot f_{DRV}$ (due to intermodulation) and at the frequency $f=f_{DRV}$ (due to offset), in addition to a spectral contribution of quantization noise, which to a first approximation increases as the frequency increases, and contributions caused by white noise and flicker noise.

For instance, the first and second lowpass filters 40, 42 may be each formed by a corresponding moving-average filter. For instance, the first lowpass filter 40 (but the same considerations also apply to the second lowpass filter 42) may implement a moving window that selects a number NUM of consecutive samples of the first product signal y[n] (for example, NUM=16 x·K2); the first lowpass filter 42 translates said moving window by one sample of the first product signal y[n] for each period equal to the reciprocal of the first sampling frequency $f_{ADC}$ and sets the value of each sample of the first filtered signal $Y_{LPF}[n]$ equal to the average of the samples of the first product signal y[n] selected by the corresponding window. This moving-average filter is characterized by the presence of zeroes at the frequencies equal to integer multiples of the driving frequency $f_{DRV}$, with consequent elimination of the aforementioned undesired spectral contributions at the frequencies $f=f_{DRV}$ and $f=2 \cdot f_{DRV}$. In addition, this moving-average filter has a profile in frequency of a lowpass type, capable of reducing the aforementioned spectral contribution of quantization noise and, more in general, the contributions of non-idealities.

As an alternative, the first and second lowpass filters 40, 42 may be formed by corresponding digital filters (for example, of an IIR type) with time constants that may be chosen so as to limit lengthening of the reaction times of the fault-detection circuit 30.

This having been said, to a first approximation the following relations thus apply:

$$XLPF[n] = \frac{Asense}{2} \cdot \cos(\Delta\varphi)$$

-continued $$YLPF[n] = \frac{Asense}{2} \cdot \sin(\Delta\varphi)$$

where, as already mentioned previously, $\Delta\varphi = \varphi sense - \varphi_{ref}$. Consequently, also the relation $$Asense = 2\sqrt{\cdot (X[n]^2 + Y[n]^2)}$$

applies.

In practice, the first and second filtered signals $Y_{LPF}[n]$, $X_{LPF}[n]$ are the DC components of the first and second product signals y[n], x[n], which are extracted by the first and second lowpass filters 40, 42 and represent an in-phase component and a quadrature component of the sampled position signal px[n].

The fault-detection circuit 30 further comprises an amplitude-estimator circuit 46.

The amplitude-estimator circuit 46 has inputs coupled to the outputs of the first and second lowpass filters 40, 42 so as to receive the first and second filtered signals $Y_{LPF}[n]$, $X_{LPF}[n]$. In particular, the amplitude-estimator circuit 46 generates, on its own output, a signal $SA_{sense}[n]$, which is a digital signal indicative, for each pair of samples of the first and second filtered signals $Y_{LPF}[n]$, $X_{LPF}[n]$, of a corresponding estimate $A_{sense}[n]'$ of the amplitude $A_{sense}$.

In greater detail, it is noted how, given a pair of samples of the first and second filtered signals $Y_{LPF}[n]$, $X_{LPF}[n]$, this represents a corresponding point $U_0$ having co-ordinates $$(X\_U_0; Y\_U_0) =$$

$$(X_{LPF}[n]; Y_{LPF}[n]) = \left( \frac{Asense}{2} \cdot \cos(\Delta\varphi); \frac{Asense}{2} \cdot \sin(\Delta\varphi) \right).$$

Said point $U_0$ falls on a circle having a radius equal to $A_{sense}/2$ and defines a corresponding vector; consequently the point $U_0$ (visible at top left in FIG. 4) contains the information regarding the value of the amplitude $A_{sense}$.

Figure 5:
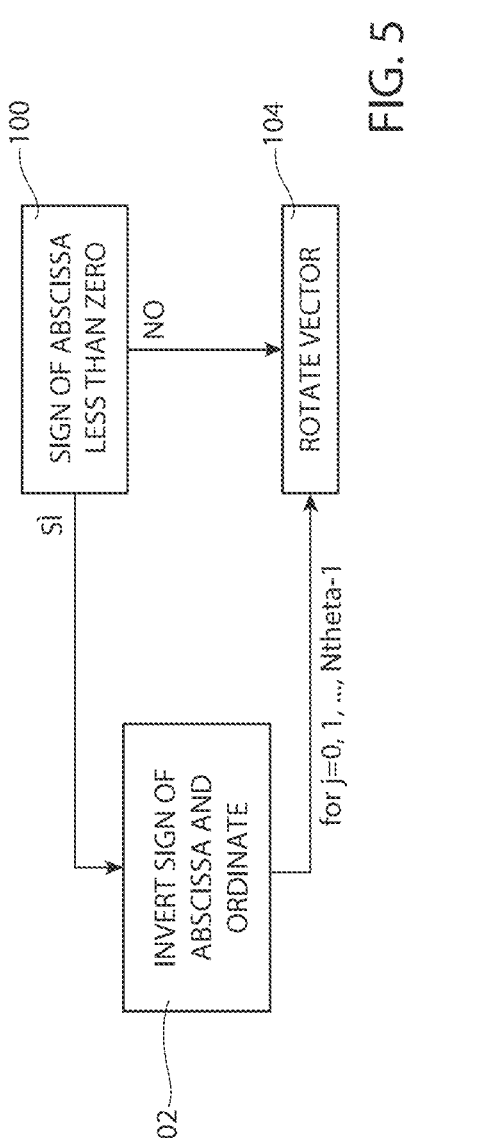
FIG. 5 shows a flowchart of operations according to a calculation algorithm.

It is further noted how, in theory, it is possible to obtain an estimate of the amplitude $A_{sense}$ by executing an algorithm of a CORDIC (CO-ordinate Rotation DIgital Computer) type illustrated in FIG. 5 and described hereinafter, with reference to a set of angles $\theta_j$ (with j=0, 1, . . . , Ntheta−1; for example, Ntheta=18), which are such that:

$$\tan(\theta_j) = 2^{-j}$$

Figure 4:
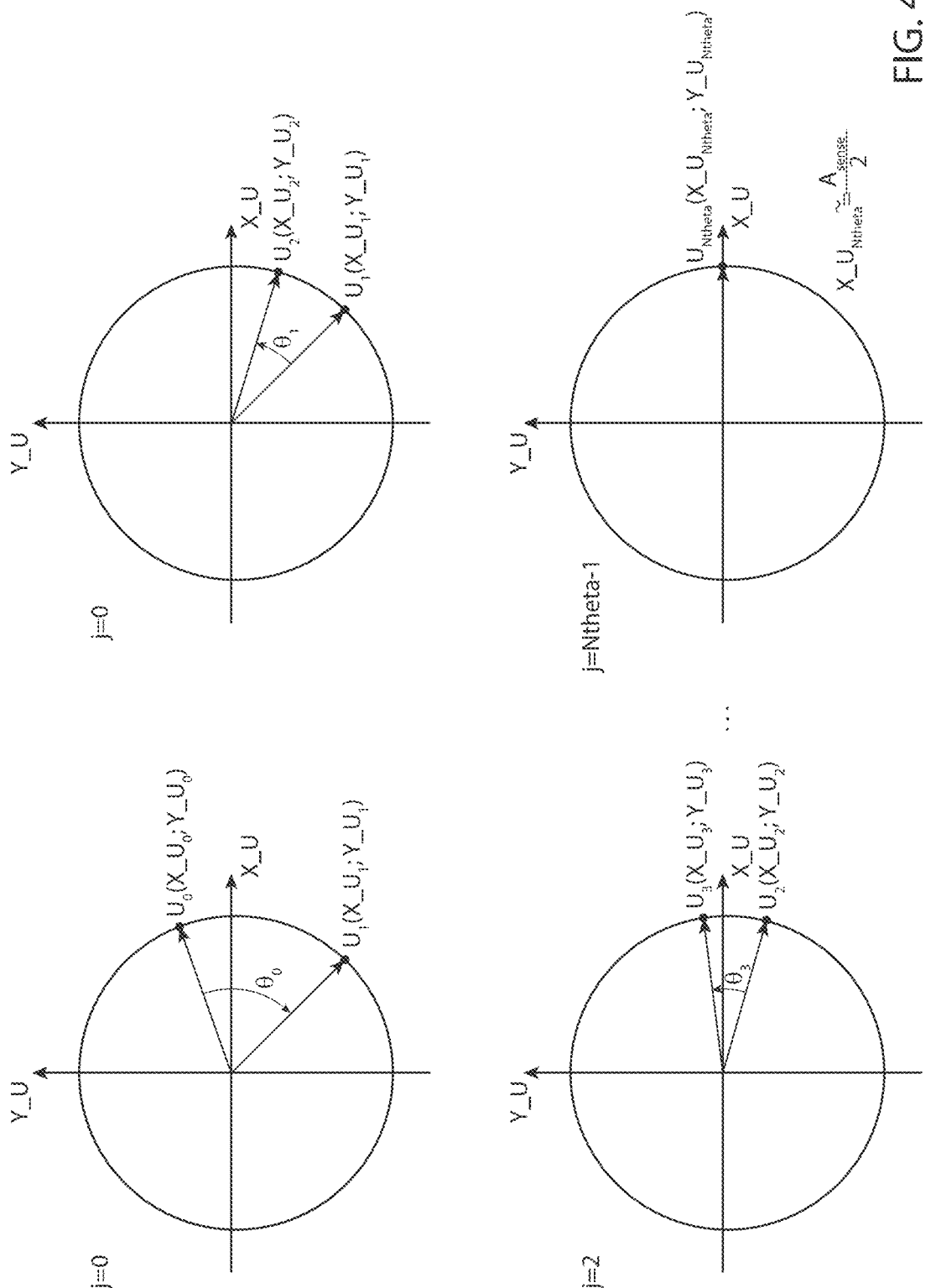
FIG. 4 is a schematic illustration of points arranged on circles in a Cartesian plane and vectors defined by said points.

In detail, the algorithm initially envisages verification (block 100, FIG. 5) as to whether the co-ordinate $X\_U_0$ (i.e., the abscissa of the point $U_0$) is less than zero. In addition, if the co-ordinate $X\_U_0$ is less than zero, the algorithm envisages inversion (block 102) of the signs of the abscissa and of the ordinate of the point $U_0$; i.e., it envisages setting $X\_U_0 = -X\_U_0$ and $Y\_U_0 = -Y\_U_0$ (in other words, the vector defined by the point $U_0$ is rotated through 180°); if not, the point $U_0$ is left unaltered. In practice, the operations of blocks 100 and 102 are such that, at the end thereof, the point $U_0$, defined by the co-ordinates $(X\_U_0; Y\_U_0)$ is in the first or in the fourth quadrant of the cartesian plane, as illustrated in FIG. 4 (top left).

Next, the algorithm envisages, for each value of j=0, 1, . . . . Ntheta−1, rotation (block 104) of the vector of the point $U_j$ of the angle $\theta_j$, respectively, in the clockwise direction, if the ordinate $Y\_U_j$ of the point $U_j$ is greater than zero (as illustrated, for example, in FIG. 4, top left, with reference to j=0), or else in the counterclockwise direction, if the ordinate $Y\_U_j$ of the point $U_j$ is less than zero (as illustrated, for example, in FIG. 4, top right and bottom left, with reference, respectively, to j=1 and j=2). The vector thus rotated defines the position of the point $U_{j+1}$, and in particular defines the corresponding co-ordinates $(X\_U_{j+1}; Y\_U_{j+1})$.

In practice, iteration of the operations of block 104 causes the point $U_{Ntheta}$, which has co-ordinates $(X\_U_{Ntheta}; Y\_U_{Ntheta})$, to lie to a first approximation on the axis of the abscissae, as may be seen in FIG. 4, bottom right. Consequently, it happens that the abscissa $X\_U_{Ntheta}$ is approximately equal to $$\frac{Asense}{2},$$

and thus contains information sufficient for estimating the amplitude $A_{sense}$.

This having been said, at a practical level, the amplitude-estimator circuit 46 stores the aforementioned angles $\theta_j$ and executes the operations described hereinafter, which are based upon the consideration that the co-ordinates $(X\_U_0; Y\_U_0)$ of the point $U_0$ are stored by the amplitude-estimator circuit 46 as corresponding bit strings (for example, in fixed-point format on a number NB+Ntheta−1 of bits, with so-called two's complement coding of the first NB bits of the string and with the Ntheta−1 least significant bits of the string set equal to '0', as illustrated in FIG. 7, where the values of the single bits of the abscissa $X\_U_0$ and ordinate $Y\_U_0$ are denoted generically by '$bx_p$' and '$by_p$', where the subscript 'p' indicates the position of the bit in the string and p=1 corresponds to the most significant bit, in such a way that the Ntheta−1 least significant bits do not encode any information and have the purpose of preventing loss of information, as explained in what follows) and each rotation through an angle $\theta_j$ may be expressed as a corresponding rotation matrix:

$$\cos(\theta j) \cdot \begin{pmatrix} 1 & -\tan(\theta j) \\ \tan(\theta j) & 1 \end{pmatrix}$$

Figure 6:
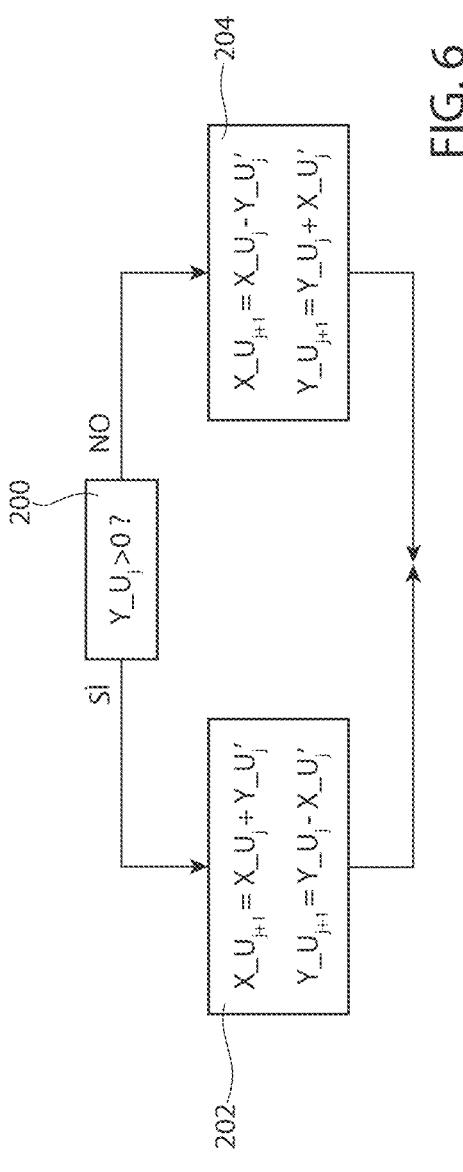
FIG. 6 shows a flowchart of operations executed by the present fault-detection circuit.

Consequently, the amplitude-estimator circuit 46 executes the operations of blocks 100 and 102 in such a way that the point $U_0$ lies in the first quadrant or fourth quadrant of the cartesian plane, and then executes, for each value of j=0, 1, . . . , Ntheta−1, the operations illustrated in FIG. 6.

In detail, the amplitude-estimator circuit 46 verifies (block 200) whether the ordinate $Y\_U_j$ of the point $U_j$ is greater than zero.

Next, if the ordinate $Y\_U_j$ of the point $U_j$ is greater than zero (output YES from block 200), the amplitude-estimator circuit 46 encodes (block 202) the position of the point $U_{j+1}$ in such a way that the corresponding bit strings are as follows:

$$X\_U_{j+1} = X\_U_j + Y\_U_j'$$

$$Y\_U_{j+1} = Y\_U_j - X\_U_j'$$

where $Y\_U_j'$ represents a quantity that is determined by the amplitude-estimator circuit 46 by shifting to the right (i.e., in the direction of the least significant bit), by a number of bits equal to j, the bit string that encodes the ordinate $Y\_U_j$, and inserting on the left a number equal to j of bits equal to the most significant bit (MSB) of the ordinate $Y\_U_j$, as represented qualitatively in FIG. 7 with reference by way of example to the case where j=1. Further, $X\_U_j'$ represents a quantity that is determined by the amplitude-estimator circuit 46 by shifting to the right, by a number of bits equal to j, the bit string that encodes the abscissa $X\_U_j$, and inserting on the left a number equal to j of bits equal to the most significant bit of the co-ordinate $X\_U_j$, as illustrated qualitatively once again in FIG. 7, with reference to the case where j=1.

In practice, the quantities $X\_U_j'$ and $Y\_U_j'$ are obtained by executing an arithmetical translation of the bit strings that encode, respectively, the co-ordinates $X\_U_j$ and $Y\_U_j$, with an extension of the sign. Said operation is far from burdensome from a computational standpoint. Further, sizing of the strings described previously prevents loss of information during the Ntheta−1 shifts (for j=0, no shift occurs).

Instead, if the ordinate $Y\_U_j$ of the point $U_j$ is less than or equal to zero (output NO from block 200), the amplitude-estimator circuit 46 encodes (block 204) the position of the point $U_{j+1}$ in such a way that the corresponding bit strings are as follows:

$$X\_U_{j+1} = X\_U_j - Y\_U_j'$$

$$Y\_U_{j+1} = Y\_U_j + X\_U_j'$$

In practice, with reference for brevity to just the operations of block 202 (but the same considerations also apply to the operations of block 204), they are equivalent to multiplying the co-ordinates $(X\_U_j; Y\_U_j)$ of the point $U_j$ by the rotation matrix for the angle $\theta_j$, but for the factor $\cos(\theta_j)$; in fact, as explained previously, $\tan(\theta_j)=2^{-j}$ and, as is known, shifting a bit string to the right for a number j of bits is equivalent to dividing the number represented by the bit string by $2^j$.

Consequently, the operations of blocks 202 and 204 are equivalent to obtaining the point $U_{j+1}$ by: i) rotation through an angle equal to $\theta_j$, respectively, in the counterclockwise direction and in the clockwise direction, of the vector defined by the point $U_j$; and ii) introduction of a scale factor equal to $1/\cos(\theta_j)$. Said operations are thus executed in an extremely effective way from the standpoint of computational complexity.

The amplitude-estimator circuit 46 then sets the estimate $A_{sense}[n]'$ equal to the product of the abscissa $X\_U_{Ntheta}$ of the point $U_{Ntheta}$ by a normalization factor KN, which in turn is equal to $2\cdot\cos(\theta_0)\cdot\cos(\theta_1)\cdot\cos(\theta_2)\cdot\ldots\cdot\cos(\theta_{Ntheta-1})$ so as to compensate for the scale factors introduced previously.

The fault-detection circuit 30 further comprises a decision circuit 48, which has an input coupled to the output of the amplitude-estimator circuit 46 so as to receive the signal $sA_{sense}$, the samples of which are indicative of the estimates $A_{sense}[n]'$ calculated by the amplitude-estimator circuit 46. In addition, the decision circuit 48 is programmable so as to store a first threshold AmpUpTh and a second threshold AmpLoTh, with AmpUpTh>AmpLoTh.

The first and second thresholds AmpUpTh and AmpLoTh delimit the range [AmpLoTh; AmpUpTh], which represents a window of admissible values (understood as values that are at a distance from an expected value not greater than a predefined limit) of the amplitude $A_{sense}$, when the micromirror 3 is driven at the desired frequency (in the present example, the resonance frequency) and in the absence of faults.

In use, the decision circuit 48 compares each estimate $A_{sense}[n]'$ with the range [AmpLoTh; AmpUpTh]. If the estimate $A_{sense}[n]'$ falls within the range [AmpLoTh; AmpUpTh] (for example, extremes included), it means that the behavior of the micromirror 3 is correct; i.e., it oscillates at the desired frequency and with an expected amplitude. Instead, if the estimate $A_{sense}[n]'$ falls outside the range [AmpLoTh; AmpUpTh], it means that the micromirror 3 does not oscillate correctly. For this purpose, the first and second thresholds AmpUpTh and AmpLoTh may, for example, be equal to $P_{avg}+\Delta$ and $P_{avg}-\Delta$, respectively, where $P_{avg}$ is the expected value of the amplitude $A_{sense}$, while $\Delta$ represents a tolerance.

In addition, the decision circuit 48 generates a signal sF, which indicates for each estimate $A_{sense}[n]'$ whether it falls inside or outside the range [AmpLoTh; AmpUpTh]. The signal sF may then be received, for example, by the control circuit 20 or by a device external to the MEMS device 2, for implementing appropriate strategies of control/switching-off of the MEMS device 2 or of a projection system that includes the MEMS device 2. For example, in the case where an estimate $A_{sense}[n]'$ falls outside the range [AmpLoTh; AmpUpTh], the projection system (not illustrated) including the MEMS device 2 may be switched off.

The fault-detection circuit 30 described previously may be formed in one and the same first semiconductor die (not illustrated) together with the analog-to-digital converter 6, the filtering circuit 10, and the control circuit 20; the oscillation driving circuit 22 may be formed in a second semiconductor die (not illustrated) and the MEMS device 2 may be formed in a third semiconductor die (not illustrated).

The advantages that the present solution affords emerge clearly from the foregoing description.

In particular, the present fault-detection circuit is characterized by a high resilience to high-frequency noise and to low-frequency noise, as well as by shorter reaction times and computational simplicity. In addition, the present fault-detection circuit operates immediately downstream of the analog-to-digital converter, instead of being coupled to the output of the filtering circuit, with consequent reduction of the times of intervention. Furthermore, said characteristic enables design of the filtering circuit without impacting on the times of intervention of the fault-detection circuit. In addition, the fault-detection circuit envisages the use of just two thresholds: the first and second thresholds AmpUpTh and AmpLoTh; this leads to a simplification of the calibration procedures.

Finally, it is clear that modifications and variations may be made to the present circuit, without thereby departing from the scope of the present invention, as defined in the annexed claims.

For instance, the amplitude-estimator circuit 46 may determine the amplitude $A_{sense}$ on the basis of the relation $$Asense = 2\sqrt{\cdot\left(X[n]^2 + Y[n]^2\right)};$$

however, calculation of this function proves computationally more burdensome. Also, generation of the samples of the first and second reference signals xref[n], yref[n] may be obtained in a way different from what has been described.

The analog-to-digital converter may be of a type different from what has been described.

In addition, the present fault-detection circuit may be used also in the case where the driving frequency $f_{DRV}$ of the micromirror 3 is different from the resonance frequency of the micromirror 3. Also in this case, in fact, the relation $f_{ref}=f_{DRV}$ applies. Further, the first and second thresholds AmpUpTh and AmpLoTh may be set in such a way that the range [AmpLoTh; AmpUpTh] indicates the admissible values of the amplitude $A_{sense}$, when the micromirror 3 is driven at the driving frequency $f_{DRV}$ and in the absence of faults.

Finally, the present fault-detection circuit may be used also in the case where the position of the mobile mass (for example, angular or linear position) has a non-sinusoidal periodic time plot, such as, for example, a time plot according to a triangular wave with a frequency equal to the oscillation frequency $f_{sense}$. Also in this case, the relation $f_{ref}=f_{sense}$ applies.

The invention claimed is:

1. A circuit for detecting faults in a MicroElectroMechanical System (MEMS) device that includes a periodically oscillating mass, comprising:

an input configured to receive a position signal formed by a succession of samples of an analog signal that is a function of a position of the periodically oscillating mass, said position signal having an amplitude and an oscillation frequency, said amplitude being directly proportional to an oscillation amplitude of the periodically oscillating mass of the MEMS device;

a reference circuit configured to generate a first reference signal formed by successions of samples of a first sinusoidal signal and generate a second reference signal formed by successions of samples of a second sinusoidal signal, wherein the first and second sinusoidal signals having a frequency equal to the oscillation frequency and are phase-shifted with respect to one another by 90°;

a first multiplier configured to multiply the position signal by the first reference signal to generate a first product signal;

a second multiplier configured to multiply the position signal by the second reference signal to generate a second product signal;

a first lowpass filter configured to filter the first product signal and generate a first filtered signal;

a second lowpass filter configured to filter the second product signal and generate a second filtered signal;

an estimator circuit configured to generate estimates of said amplitude as a function of the first and second filtered signals; and a decision circuit configured to perform a comparison of the estimates of said amplitude with a range of values to detect the presence of faults in the periodic oscillation of the mass of the MEMS device.

2. The circuit according to claim 1, wherein the first and second lowpass filters are configured to extract DC components of the first and second product signals, respectively.

3. The circuit according to claim 1, wherein the estimator circuit is configured to store a succession of a number Ntheta of angles θj indexed by an index j and such that:

$$\tan(\theta j)=2-j, \text{ with } j=0,1,2,\ldots,\text{Ntheta}-1;$$

and wherein, for each pair of samples of the first and second filtered signals, the estimator circuit is configured to:

encode a first co-ordinate and a second co-ordinate of a first point on corresponding bit strings so that each of the first and second co-ordinates of the first point is, respectively, equal to a corresponding sample of the pair of samples; and then when the first co-ordinate of the first point is negative, invert signs of the first and second co-ordinates of the first point; and then starting from the first point, encode, for each angle θj of the succession of angles, the first and second co-ordinates of a corresponding point on corresponding bit strings so as to determine a succession of points including the first point; and wherein the estimator circuit is further configured to encode, for each angle θj of the succession of angles, the first and second co-ordinates of the corresponding point in such a way that:

when the second co-ordinate of the previous point is greater than zero, the first co-ordinate of the point is equal to the sum of the first co-ordinate of the previous point and of a first quantity, and the second co-ordinate of the point is equal to the difference between the second co-ordinate of the previous point and a second quantity; and when the second co-ordinate of the previous point is less than or equal to zero, the first co-ordinate of the point is equal to the difference between the first co-ordinate of the previous point and the first quantity, and the second co-ordinate of the point is equal to the sum of the second co-ordinate of the previous point and of the second quantity; and wherein the estimator circuit is further configured to determine said first and second quantities by a translation, in the direction of the least significant bit and by a number of bits equal to the index j of the corresponding angle θj, of the bits of the strings that encode, respectively, the second co-ordinate of the previous point and the first co-ordinate of the previous point; and wherein the estimator circuit is further configured to determine, for each pair of samples of the first and second filtered signals, a corresponding estimate of said amplitude, on the basis of the first co-ordinate of the last point of the corresponding succession of points.

4. The circuit according to claim 1, wherein the first and second lowpass filters are moving-average filters.

5. The circuit according to claim 1, wherein the reference circuit is configured to generate each sample of each pair of samples of the first and second reference signals on the basis of a linear combination of the samples of the previous pair of samples of the first and second reference signals.

6. An electronic circuit, comprising:

the fault-detection circuit according to claim 1; and an analog-to-digital conversion circuit configured to be coupled to the MEMS device and generate the position signal.

7. The electronic circuit according to claim 6, further comprising:

a control circuit configured to generate, on the basis of the position signal, a timing signal phase-locked with said analog signal and having a frequency that is a multiple of the oscillation frequency; and a driving circuit configured to be controlled by the control circuit so as to generate a driving signal for application to the MEMS device so as to cause oscillation of the periodically oscillating mass, the driving signal having a frequency equal to the oscillation frequency and a respective amplitude; and wherein the control circuit and the driving circuit are further configured to control the amplitude of the driving signal so as to form a closed control loop for control of said amplitude of the analog signal.

8. An electronic system, comprising:

the electronic circuit according to claim 7; and the MEMS device.

9. A method for detecting faults in a MicroElectroMechanical System (MEMS) device that includes a periodically oscillating mass, said method comprising:

receiving a position signal formed by a succession of samples of an analog signal that is a function of a position of the periodically oscillating mass and has an amplitude and an oscillation frequency, said amplitude being directly proportional to an oscillation amplitude of the periodically oscillating mass of the MEMS device;

generating a first reference signal formed by successions of samples of a first sinusoidal signal;

generating a second reference signal formed by successions of samples of a second sinusoidal signal;

wherein the first and second sinusoidal signals have a frequency equal to the oscillation frequency and are phase-shifted with respect to one another by 90°;

multiplying the position signal by the first reference signal to generate a first product signal;

multiply the position signal by the second reference signal to generate a second product signal via;

lowpass filtering the first product signal to generate a first filtered signal;

lowpass filtering the second product signal to generate a second filtered signal;

generating estimates of said amplitude as a function of the first and second filtered signals; and comparing the estimates of said amplitude with a range of values to detect the presence of faults in the periodic oscillation of the mass of the MEMS device.

10. The method according to claim 9, wherein lowpass filtering comprises extracting DC components of the first and second product signals.

11. The method according to claim 9, further comprising:

storing a succession of a number Ntheta of angles $\theta j$ indexed by an index j and such that $\tan(\theta j)=2-j$, with $j=0, 1, 2, \ldots, \text{Ntheta}-1$;

for each pair of samples of the first and second filtered:

encoding a first co-ordinate and a second co-ordinate of a first point on corresponding bit strings so that each of the first and second co-ordinates of the first point are, respectively, equal to a corresponding sample of the pair; and then when the first co-ordinate of the first point is negative, inverting the signs of the first and second co-ordinates of the first point; and then starting from the first point, encoding, for each angle $\theta j$ of the succession of angles, the first and second co-ordinates of a corresponding point on corresponding bit strings so as to determine a succession of points including the first point;

encoding, for each angle $\theta j$ of the succession of angles, the first and second co-ordinates of the corresponding point in such a way that:

when the second co-ordinate of the previous point is greater than zero, the first co-ordinate of the point is equal to the sum of the first co-ordinate of the previous point and of a first quantity, and the second co-ordinate of the point is equal to the difference between the second co-ordinate of the previous point and a second quantity; and when the second co-ordinate of the previous point is less than or equal to zero, the first co-ordinate of the point is equal to the difference between the first co-ordinate of the previous point and the first quantity, and the second co-ordinate of the point is equal to the sum of the second co-ordinate of the previous point and of the second quantity;

determining said first and second quantities via a translation, in the direction of the least significant bit and by a number of bits equal to the index j of the corresponding angle $\theta j$, of the bits of the strings that encode, respectively, the second co-ordinate of the previous point and the first co-ordinate of the previous point; and determining, for each pair of samples of the first and second filtered signals, a corresponding estimate of said amplitude, on the basis of the first co-ordinate of the last point of the corresponding succession of points.

12. The method according to claim 9, wherein lowpass filtering comprises performing a moving average filtering of the first and second product signals.

13. The method according to claim 9, comprising generating each sample of each pair of samples of the first and second reference signals on the basis of a linear combination of the samples of the previous pair of samples of the first and second reference signals.

\* \* \* \* \*